United States Patent
Ballenger et al.

(10) Patent No.: US 6,621,705 B1
(45) Date of Patent: Sep. 16, 2003

(54) MINIATURE SURFACE MOUNT HEATSINK ELEMENT AND METHOD OF USE

(75) Inventors: Robert Ballenger, San Jose, CA (US); David A. Popovich, San Jose, CA (US); Yida Zou, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/121,350

(22) Filed: Apr. 12, 2002

(51) Int. Cl.[7] .................................................. H05K 7/20
(52) U.S. Cl. .................. 361/719; 361/704; 361/707; 361/712; 361/717; 361/718; 361/760; 165/80.3; 165/185; 257/706; 257/707
(58) Field of Search ..................... 361/704, 707, 361/709, 710, 712, 717, 718, 719, 760, 767; 257/706, 707; 174/16.1, 16.3; 165/80.2, 80.3, 185

(56) References Cited

U.S. PATENT DOCUMENTS

| | | | | |
|---|---|---|---|---|
| 4,682,269 A | * | 7/1987 | Pitasi | 361/704 |
| 4,720,770 A | * | 1/1988 | Jameson | 361/705 |
| 5,113,315 A | * | 5/1992 | Capp. Michael L. et al. | 361/704 |
| 5,258,887 A | * | 11/1993 | Fortune | 361/720 |
| 5,659,458 A | * | 8/1997 | Patchen | 361/704 |
| 5,933,324 A | * | 8/1999 | Barrett | 361/703 |
| 5,999,408 A | * | 12/1999 | Koon et al. | 361/704 |
| 6,212,071 B1 | * | 4/2001 | Roessler et al. | 361/704 |
| 6,477,054 B1 | * | 11/2002 | Hagerup | 361/720 |

* cited by examiner

Primary Examiner—Boris Chervinsky
(74) Attorney, Agent, or Firm—Thelen Reid & Priest LLP; Thierry K. Lo

(57) ABSTRACT

A printed circuit board (PCB) has at least a first surface. A patterned electrically and thermally conductive layer is disposed on the first surface. A surface mount device (SMD) is disposed on an area of the layer and is attached thereto with solder. Heatsink elements, each including at least one flat surface, are placed by a pick and place assembly robot and permanently attached to the area with solder.

11 Claims, 2 Drawing Sheets

US 6,621,705 B1

MINIATURE SURFACE MOUNT HEATSINK ELEMENT AND METHOD OF USE

FIELD OF THE INVENTION

The present invention relates to heatsinks. More particularly, the present invention relates to surface mount heatsink elements on printed circuit boards.

BACKGROUND OF THE INVENTION

As circuit board components require more power, some of the surface mount devices (SMDs) have become more dependent on using the printed circuit board (PCB) as a primary thermal path to a heat sink. Typically, the SMD relies on a copper pad upon which it is mounted and upon thermal vias to help carry away the thermal energy generated during operation through the layers of the PCB. FIG. 1 illustrates a SMD disposed on a PCB in accordance with the prior art. A PCB 102 has a first copper pad 104 disposed on one surface, and a second copper pad 106 disposed on the opposite surface. Thermal vias 108 thermally connect the first copper pad 104 to the second copper pad 106. A SMD 110 is mounted on the first copper pad 104 such that the SMD 110 is thermally coupled directly to the first copper pad 104. The heat generated by the SMD 110 dissipates through the first copper pad 104, down through the thermal vias 108, and through the second copper pad 106.

However, the PCB 102 provides a relatively poor thermal path to dissipate the heat generated by the SMD 110. The copper pads 104 and 106 and the thermal vias 108 provide poor air exposure and poor thermal paths. One solution involves increasing the effective copper pad surface by expanding the surface area of the copper pads 104, 106 relative to the SMD 110 such that a greater surface area on the copper pads 104, 106 is exposed to air. However, that solution would require more space on the PCB 110 which is usually unavailable.

Another solution involves customizing a heatsink (not shown) on a top surface of the SMD 110. The heatsink is thermally coupled directly to the top surface of the SMD 110. However the heatsink needs to be customized for every SMD used in this fashion since the shape of a heatsink for one SMD may be completely different from the shape of a heatsink for another SMD. Such customization proves to be inefficient and costly.

It would be desirable to provide a PCB capable of efficiently providing thermal paths through scalable thermal conductive elements that flexibly adapt to any SMD shape, thereby saving costs and board space.

BRIEF DESCRIPTION OF THE INVENTION

A printed circuit board (PCB) has at least a first surface. A patterned electrically and thermally conductive layer is disposed on the first surface. A surface mount device (SMD) is disposed on an area of the layer and is attached thereto with solder. Heatsink elements, each including at least one flat surface, are placed by a pick and place assembly robot and permanently attached to the area with solder.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings.

DETAILED DESCRIPTION

Embodiments of the present invention are described herein in the context of surface mount heatsink elements. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
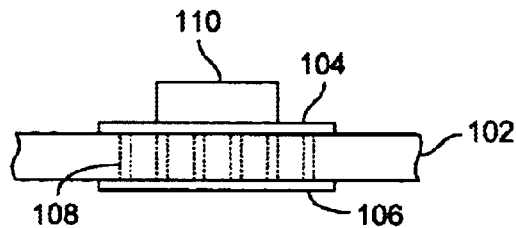
FIG. 1 is a schematic cross-section of a printed circuit board (PCB) receiving a surface mounted device (SMD) in accordance with the prior art.
Figure 2A:
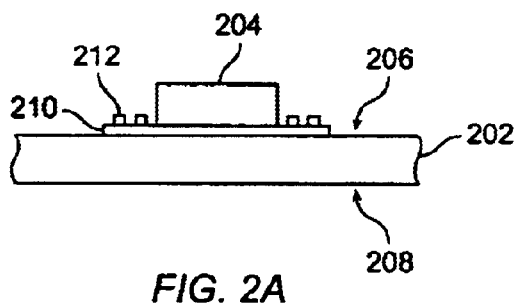
FIG. 2A is a schematic cross-section of a PCB having heatsink elements dissipating heat from a SMD according to one embodiment of the present invention.

FIG. 2A illustrates a cross-section schematic of a printed circuit board (PCB) 202 receiving a surface mount device (SMD) 204 and heatsink elements. The SMD 204 may be any device surface mounted on the PCB 202. For example, FIG. 2A illustrates a surface mount power supply module. The PCB 202 has a top surface 206 and a bottom surface 208. The top surface 206 of the PCB 202 includes a patterned electrically and thermally conductive layer 210, such as copper or aluminum. The SMD 204 is disposed on an area of the thermally conductive layer 210 and attached thereto with solder (not shown). Therefore, the thermally conductive layer 210 provides a direct transfer path for the heat generated by the SMD 204. All heatsink elements 212 include at least one flat surface that is attached to the area of the thermally conductive layer 210 with solder (not shown). The heatsink elements 212 illustrated on FIG. 2A aggregately form a heatsink dissipating heat from the thermally conductive layer 210 and the SMD 204.

Figure 2B:
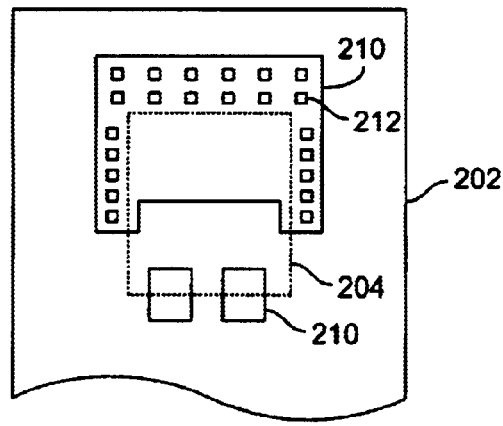
FIG. 2B is a schematic top view of a PCB having heatsink elements dissipating heat from a SMD according to one embodiment of the present invention.

FIG. 2B illustrates a top view schematic of the PCB in FIG. 2A. As way of illustration, FIG. 2B illustrates an example of an SMD on the PCB. In particular, the SMD 204 in FIG. 2B is a surface mount power supply module. The heatsink elements 212 are thermally coupled directly on the conductive layer 210 around the SMD 204;

Each heatsink element dissipates heat by providing lower thermal impedance from the conductive layer of the PCB to the air stream around it. These heatsink elements provide an increased surface area that creates turbulence to the air stream. These heatsink elements located during the PCB layout, are loaded using pick and place methods. The heatsink elements include a high thermal conductivity material. According to one embodiment, the heatsink element has a thermal conductivity of at least 200 W/mK. For example, the thermal conductive elements may include copper or aluminum. According to one embodiment of the present invention, each heatsink element comprises a standard shape and size such that the aggregate heatsink elements form a heatsink pattern effectively dissipating heat. The shape and pattern for each heatsink element is discussed in more detail in FIG. 6.

Figure 3:
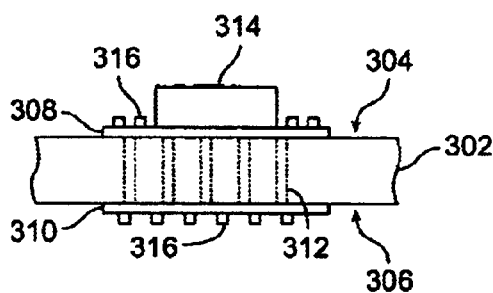
FIG. 3 is a schematic cross-section of a PCB having heatsink elements dissipating heat from a SMD according to another embodiment of the present invention.

FIG. 3 illustrates another embodiment of the present invention. A PCB 302 has a first surface 304 and a second surface 306. The first surface 304 includes a first patterned electrically and thermally conductive layer 308. The second surface 306 includes a second patterned electrically and thermally conductive layer 310. Both first and second conductive layers 308 and 310 include a highly conductive material, such as copper or aluminum. Thermal vias 312 thermally couple the first conductive layer 308 to the second conductive layer 310. Thermal vias 312 provide a preferred thermal path for the heat originating from an SMD 314 soldered on the first conductive layer 308. Heatsink elements 316 are thermally coupled to both the first and second conductive layers 308 and 310. The thermal coupling may be accomplished through soldering the heatsink elements 316 to the conductive layers 308 and 310, or pasting a thermally conductive adhesive (not shown) between the heatsink elements 316 and the conductive layers 308 and 310. Heat originating from the SMD 314 can therefore dissipate through the heatsink elements 316 on the conductive layers 308 and 310.

Figure 4:
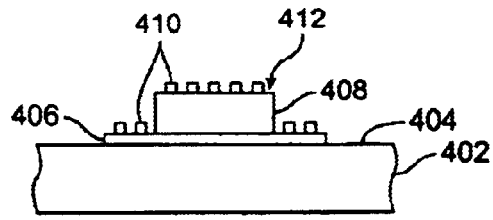
FIG. 4 is a schematic cross-section of a PCB having heatsink elements dissipating heat from a SMD according to an alternative embodiment of the present invention.

FIG. 4 illustrates another embodiment of the present invention. A PCB 402 has a surface 404 including a patterned electrically and thermally conductive layer 406. An SMD 408 is soldered to the conductive layer 406 of the PCB 402. Heatsink elements 410 may be thermally coupled directly to the conductive layer 406 and/or a top surface 412 of the SMD 408. When thermally coupled to the top surface 412 of the SMD 408, the heatsink elements 410 act as a heatsink for the SMD 408. According to one embodiment, rather than using traditional adhesive mounted heatsinks, the heatsink elements 410 forming a heatsink are picked and placed onto ASICs or other IC packages that are soldered to the conductive layer 406. For example, thermally adhesive may be squirted onto the ASICs in the appropriate locations, then the heatsink elements are picked and placed onto a surface of the ASIC.

Figure 5:
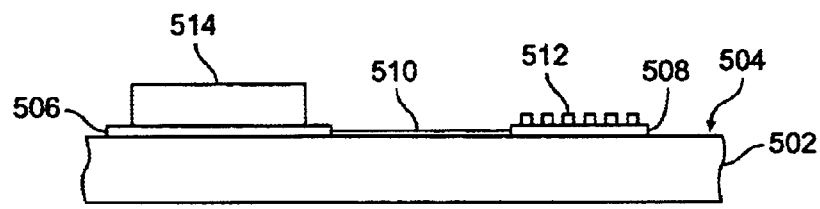
FIG. 5 is a schematic cross-section of a PCB having heatsink elements to dissipate heat from a SMD according to another alternative embodiment of the present invention.

FIG. 5 illustrates another embodiment of the present invention. A PCB 502 has a surface 504 comprising a first patterned electrically and thermally conductive layer 506 and a second patterned electrically and thermally conductive layer 508. Both conductive layers 506 and 508 are thermally coupled through a thermally conductive trace 510 and/or thermal vias (not shown) disposed through all layers of the PCB 502. Heatsink elements 512 are thermally coupled directly on the surface of the second conductive layer 508 forming a heatsink. Heat originating from, for example, a SMD 514 thermally coupled to the first conductive layer 506 travels through the thermally conductive trace 510 and/or thermal vias (not shown) and dissipates through the heatsink elements 512. Such arrangement allows a component soldered to a conductive surface of the PCB to have its heat dissipated at a remote location on the PCB 502.

Figure 6:
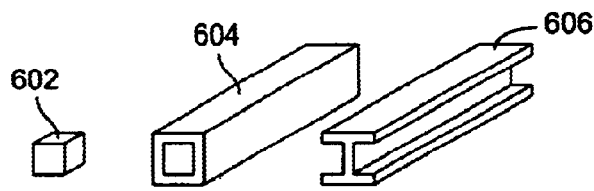
FIG. 6 is a schematic of possible shapes for the heatsink element according to one embodiment of the present invention.

FIG. 6 illustrates examples of heatsink element shapes. For example, One thermally conductive element may be in the shape of a solid copper cube 602 having various sizes. Another thermally conductive element may be in the shape of copper slugs of various heights with various footprints (not shown), or hollow copper tubes 604 that are either circular or square in shape. The heatsink element may also be in the shape of an "I" beam bar shape 606. Those of ordinary skills will recognize that the heatsink elements may include many other shapes not limited to the shapes shown in FIG. 6.

Figure 7:
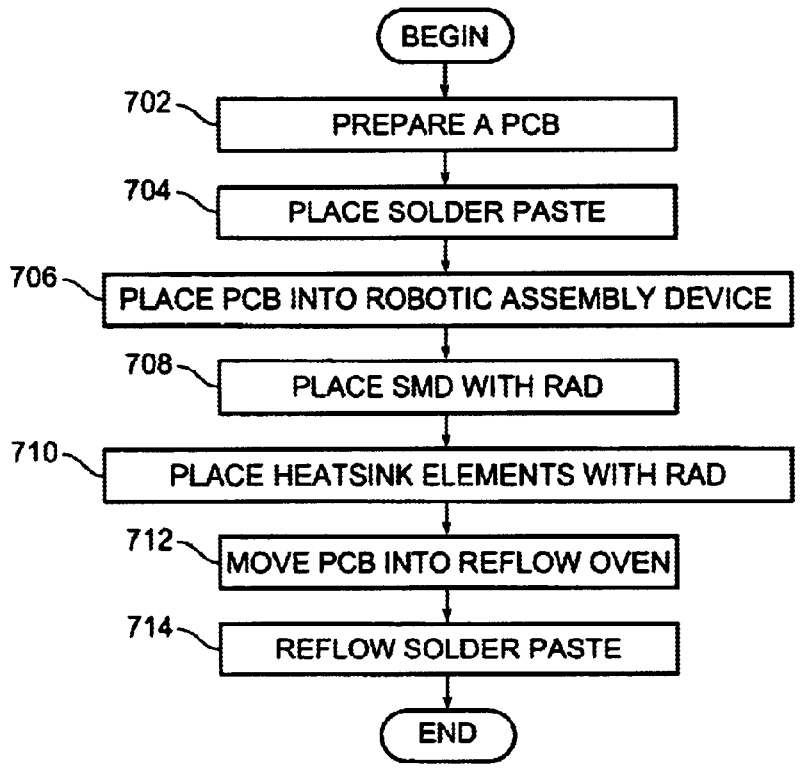
FIG. 7 is a flow diagram illustrating a method for providing a heat dissipation mechanism to a printed circuit board (PCB) according to one embodiment of the present invention.

FIG. 7 illustrates a flow diagram of a method for providing a heat dissipation mechanism to a printed circuit board (PCB). In a first block 702, a PCB is prepared with at least a first surface having a patterned electrically and thermally conductive layer disposed in the first surface. The first surface includes an area for receiving a surface mount device (SMD) and heatsink elements. In block 704, solder paste is placed on portions of the first surface. In block 706, the PCB is placed into a robotic assembly device (RAD). In block 708, the RAD places the SMD on the area on the first surface of the PCB. In block 710, the RAD also places heatsink elements on the area on the first surface of the PCB. In block 712, the PCB is then moved into a reflow oven in block. In block 714, the reflow oven is used to reflow the solder paste.

The heatsink elements discussed above save cost by avoiding the need for customizing heatsinks for every component design. In particular, the heatsink elements can be placed on the PCB and adapt to any pattern or shape of the conductive layer. Thus, the PCB does not need to have shapes specifically conforming to any existing standard heatsink.

In addition, the heatsink elements not only lower the temperature of the component mounted on the PCB but the temperature of the PCB structure as well. Because of the low profile of the thermally conductive element, PCBs may not need additional space in between them when they are stacked in a mainframe.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. A printed circuit board (PCB), comprising;

at least a first surface;

a patterned layer disposed on said first surface, said patterned layer being electrically and thermally conductive;

a surface mount device (SMD) disposed on said patterned layer and attached thereto with solder; and a plurality of heatsink elements disposed on said patterned layer, each of said heatsink elements including a first flat surface attached to said patterned layer with solder, a second flat surface substantially parallel to the first flat surface, and at least one third flat surface connecting the first and second flat surfaces.

2. The PCB according to claim 1, further comprising:

a plurality of heatsink elements disposed on an upper surface of said SMD, each of said heatsink elements including a first flat surface attached to the upper surface of said SMD with solder, a second flat surface substantially parallel to the first flat surface, and at least one third flat surface connecting the first and second flat surfaces.

3. The PCB according to claim 1 wherein said heatsink elements have a thermal conductivity of at least about 200 W/mK.

4. The PCB according to claim 1 wherein each of said heatsink elements includes a pair of the third flat surfaces connecting both sides of the first and second flat surfaces, thereby forming a thermally conductive square tube.

5. The PCB according to claim 1 wherein each of said heatsink elements includes a single third flat surface substantially vertically connecting the first and second flat surfaces along centerlines thereof, thereby forming a elongated thermally conductive beam having an "I" shaped cross section.

6. The PCB according to claim 1, wherein said first pattered layer includes:

a first area on which said SMD is disposed;

a second area on which said heatsink elements are disposed; and a thermal link coupling said first area to said second area.

7. A printed circuit board (PCB), comprising:

a first surface and a second surface;

a first patterned layers disposed on said first surface, said first patterned layer being electrically and thermally conductive;

a second patterned layer disposed on said second surface, said second patterned layer being electrically and thermally conductive;

a surface mount device (SMD) disposed on said first patterned layers and attached thereto with solder;

a plurality of thermal vias coupling said first patterned layer through said PCB to said second patterned layers; and a plurality of heatsink elements disposed on said second layer, each of said heatsink elements including a first flat surface, attached to said second patterned layer with solder, a second flat surface substantially parallel to the first flat surface, and at least one third flat surface connecting the first and second flat surfaces.

8. The PCB according to claim 7, further comprising:

a plurality of heatsink elements disposed on said first patterned layer, each of said heatsink elements including a first flat surface attached to said first patterned layer with solder, a second flat surface substantially parallel to the first flat surface, and at least one third flat surface connecting the first and second flat surfaces.

9. The PCB according to claim 7, further comprising:

a plurality of heatsink elements disposed on an upper surface of said SMD, each of said heatsink elements including a first flat surface attached to the upper surface of said SMD with solder, a second flat surface substantially parallel to the first flat surface, and at least one third flat surface connecting the first and second flat surfaces.

10. The PCB according to claim 7 wherein said heatsink elements has a thermal conductivity of at least about 200 W/mK.

11. The PCB according to claim 8, wherein said first pattered layer includes:

a first area on which said SMD is disposed;

a second area on which said heatsink elements are disposed; and a thermal link coupling said first area to said second area.

* * * * *

UNITED STATES PATENT AND TRADEMARK OFFICE
CERTIFICATE OF CORRECTION

PATENT NO. : 6,621,705 B1
DATED : September 16, 2003
INVENTOR(S) : Robert Ballenger, David A. Popovich and Yida Zou It is certified that error appears in the above-identified patent and that said Letters Patent is hereby corrected as shown below:

Column 3,
Line 13, replace "204;" with -- 204. --.

Column 6,
Line 7, replace "layers" with -- layer --.

Signed and Sealed this

Thirteenth Day of January, 2004

JON W. DUDAS
*Acting Director of the United States Patent and Trademark Office*